US010394372B2

(12) United States Patent
Gu et al.

(10) Patent No.: US 10,394,372 B2
(45) Date of Patent: Aug. 27, 2019

(54) SHIFT REGISTER AND DRIVING METHOD THEREOF, DRIVING CIRCUIT AND DISPLAY APPARATUS

(71) Applicants:BOE TECHNOLOGY GROUP CO., LTD., Beijing (CN); Hefei BOE Optoelectronics Technology Co., Ltd., Hefei, Anhui (CN)

(72) Inventors: Honggang Gu, Beijing (CN); Xianjie Shao, Beijing (CN); Jie Song, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 15/527,819

(22) PCT Filed: Nov. 30, 2016

(86) PCT No.: PCT/CN2016/107973
§ 371 (c)(1),
(2) Date: May 18, 2017

(87) PCT Pub. No.: WO2017/128854
PCT Pub. Date: Aug. 3, 2017

(65) Prior Publication Data
US 2018/0107329 A1    Apr. 19, 2018

(30) Foreign Application Priority Data

Jan. 28, 2016   (CN) .......................... 2016 1 0061091

(51) Int. Cl.
G09G 3/20      (2006.01)
G06F 3/041     (2006.01)
G11C 19/28     (2006.01)

(52) U.S. Cl.
CPC ............. *G06F 3/0416* (2013.01); *G09G 3/20* (2013.01); *G11C 19/28* (2013.01); *G09G 2310/0267* (2013.01); *G09G 2310/0286* (2013.01)

(58) Field of Classification Search
CPC ......... G09G 2310/0296; G09G 3/3266; G09G 3/3674
See application file for complete search history.

(56) References Cited

U.S. PATENT DOCUMENTS 9,459,730 B2 * 10/2016 Long ..................... G09G 3/3677
9,530,521 B2 * 12/2016 Ma ........................ G11C 19/184
(Continued)

FOREIGN PATENT DOCUMENTS

CN        102682692 A      9/2012
CN        104252853 A  * 12/2014
(Continued)

OTHER PUBLICATIONS

International Search Report dated Mar. 2, 2017 corresponding to International Application No. PCT/CN2016/107973.
(Continued)

*Primary Examiner* — Patrick F Marinelli
(74) *Attorney, Agent, or Firm* — Nath, Goldberg & Meyer; Joshua B. Goldberg; Daniel Bissing

(57) ABSTRACT

The present invention discloses a shift register for a touch display panel and a driving method thereof, a driving circuit and a display apparatus. The shift register includes a pull-up unit, a pull-down unit and an output unit, the pull-up unit controls a potential of the pull-up node according to input
(Continued)

signals of the input terminal, the second signal terminal and the reset terminal and a potential of the pull-down node, the pull-down unit controls the potential of the pull-down node according to an input signal of the first signal terminal and the potential of the pull-up node, and the output unit controls an output signal of the output terminal according to the input signals of the first signal terminal and the second signal terminal and the potentials of the pull-down node and the pull-up node.

11 Claims, 10 Drawing Sheets

(56) References Cited

U.S. PATENT DOCUMENTS

| | | | | |
|---|---|---|---|---|
| 9,627,089 | B2* | 4/2017 | Qi | G11C 19/184 |
| 9,690,419 | B2* | 6/2017 | Zhang | G11C 19/28 |
| 9,791,968 | B2* | 10/2017 | Hu | G09G 3/20 |
| 9,799,293 | B2* | 10/2017 | Xiao | G02F 1/133 |
| 9,824,659 | B2* | 11/2017 | Gu | G06F 3/0412 |
| 9,865,220 | B2* | 1/2018 | Ren | G09G 3/3696 |
| 9,916,039 | B2* | 3/2018 | Gu | G06F 3/0412 |
| 9,933,889 | B2* | 4/2018 | Xiao | G06F 3/0416 |
| 2008/0012818 | A1* | 1/2008 | Lee | G09G 3/3677 345/100 |
| 2008/0285705 | A1 | 11/2008 | Wei et al. | |
| 2011/0228893 | A1 | 9/2011 | Tobita et al. | |
| 2012/0182050 | A1* | 7/2012 | Yang | G09G 3/3266 327/109 |
| 2014/0078029 | A1* | 3/2014 | Jang | G09G 3/32 345/82 |
| 2014/0133621 | A1* | 5/2014 | Shang | G11C 19/184 377/67 |
| 2014/0168044 | A1* | 6/2014 | Hu | G09G 3/3696 345/90 |
| 2015/0187320 | A1* | 7/2015 | Ren | G09G 3/3696 345/87 |
| 2015/0302934 | A1* | 10/2015 | Qi | G11C 19/184 377/54 |
| 2015/0302936 | A1* | 10/2015 | Ma | G11C 19/184 377/64 |
| 2015/0346904 | A1* | 12/2015 | Long | G09G 3/3677 345/174 |
| 2016/0049126 | A1* | 2/2016 | Zhang | G09G 3/3648 345/173 |
| 2016/0225336 | A1* | 8/2016 | Gu | G11C 19/28 |
| 2016/0365061 | A1* | 12/2016 | Hong | G06F 3/041 |
| 2017/0010731 | A1* | 1/2017 | Zhang | G11C 19/28 |
| 2017/0108989 | A1* | 4/2017 | Gu | G06F 3/0412 |
| 2017/0199617 | A1* | 7/2017 | Gu | G06F 3/0416 |
| 2017/0221441 | A1* | 8/2017 | Gu | G06F 3/0412 |
| 2017/0269769 | A1* | 9/2017 | Hu | G09G 3/20 |
| 2017/0287428 | A1* | 10/2017 | Xue | G09G 3/3677 |
| 2017/0364170 | A1* | 12/2017 | Gu | G02F 1/1362 |
| 2018/0025695 | A1* | 1/2018 | Han | G09G 3/3677 345/213 |
| 2018/0046311 | A1* | 2/2018 | Gu | G11C 19/28 |
| 2018/0107329 | A1* | 4/2018 | Gu | G09G 3/20 |
| 2018/0190364 | A1* | 7/2018 | Gu | G11C 19/184 |
| 2018/0196563 | A1* | 7/2018 | Iwase | G09G 3/20 |
| 2018/0204521 | A1* | 7/2018 | Gu | G09G 3/36 |

FOREIGN PATENT DOCUMENTS

| | | |
|---|---|---|
| CN | 105096847 A | 11/2015 |
| CN | 105096879 A | 11/2015 |
| CN | 105185343 A | 12/2015 |
| CN | 105513522 A | 4/2016 |

OTHER PUBLICATIONS

First Office Action dated Sep. 5, 2017 corresponding to Chinese application No. 201610061091.9.

* cited by examiner

SHIFT REGISTER AND DRIVING METHOD THEREOF, DRIVING CIRCUIT AND DISPLAY APPARATUS

This is a National Phase Application filed under 35 U.S.C. 371 as a national stage of PCT/CN2016/107973, filed Nov. 30, 2016, an application claiming the benefit of Chinese Application No. 201610061091.9, filed Jan. 28, 2016, the content of each of which is hereby incorporated by reference in its entirety.

TECHNICAL FIELD

The present invention relates to the field of display technology, and particularly relates to a shift register and a driving method thereof, a driving circuit and a display apparatus.

BACKGROUND

Driver of a display panel mainly includes a data driver and a gate driver. In a gate driver, one shift register is connected to one of gate lines, and a plurality of cascaded shift registers output driving signals, so that pixels arranged in an array are scanned row by row.

With the development of touch screen technology, touch display panels integrated with a touch function and a display function have drawn more and more attention. The touch display panels are mainly classified into two types, i.e., an add-on type and an embedded type. Existing embedded touch display panels are classified into in-cell touch display panels and on-cell touch display panels. In an on-cell touch display panel, sensors are provided outside a display panel and protection glass is then attached. In an in-cell touch display panel, sensors are provided on an array substrate side, or on array substrate and color filter substrate sides, and then a display panel is formed, thereby achieving a touch function. Currently, an in-cell touch display panel performs data transmission by way of scanning to achieve a touch function. However, a driving signal and a touch signal may interfere with each other, thereby influencing the touch function.

SUMMARY

In view of the above problem, the present invention provides a shift register for a touch display panel and a driving method thereof a driving circuit and a display apparatus to solve the problem that a driving signal and a touch signal of a touch display panel in the prior art interfere with each other to influence a touch function.

Therefore, the present invention provides a shift register, comprising:

a pull-up unit, connected to an input terminal, a first voltage terminal, a second voltage terminal, a third voltage terminal, a second signal terminal, a reset terminal, an output terminal, a pull-down node and a pull-up node, respectively, and configured to control a potential of the pull-up node according to input signals of the input terminal, the second signal terminal and the reset terminal and a potential of the pull-down node;

a pull-down unit, connected to a first signal terminal, the third voltage terminal, the pull-up node and the pull-down node, respectively, and configured to control the potential of the pull-down node according to an input signal of the first signal terminal and the potential of the pull-up node; and an output unit, connected to the third voltage terminal, the first signal terminal, the second signal terminal, the output terminal, the pull-down node and the pull-up node, respectively, and configured to control an output signal of the output terminal according to the input signals of the first signal terminal and the second signal terminal and the potentials of the pull-down node and the pull-up node.

Optionally, the pull-up unit comprises:

an input module, connected to the input terminal, the first voltage terminal and the pull-up node, respectively, and configured to control the potential of the pull-up node according to the input signal of the input terminal;

a pull-up module, connected to the third voltage terminal, the second signal terminal, the output terminal, the pull-down node and the pull-up node, respectively, and configured to control the potential of the pull-up node according to the input signal of the second signal terminal and the potential of the pull-down node; and a reset module, connected to the second voltage terminal, the reset terminal and the pull-up node, respectively, and configured to control the potential of the pull-up node according to the input signal of the reset terminal.

Optionally, the pull-down unit comprises a sixth transistor and a second capacitor;

a gate of the sixth transistor is connected to the pull-up node, a first electrode of the sixth transistor is connected to the pull-down node, and a second electrode of the sixth transistor is connected to the third voltage terminal; and the second capacitor is connected between the pull-down node and the first signal terminal.

Optionally, the output unit comprises a third transistor, a fourth transistor and a fifth transistor;

a gate of the third transistor is connected to the pull-up node, a first electrode of the third transistor is connected to the first signal terminal, and a second electrode of the third transistor is connected to the output terminal;

a gate of the fourth transistor is connected to the second signal terminal, a first electrode of the fourth transistor is connected to the output terminal, and a second electrode of the fourth transistor is connected to the third voltage terminal; and a gate of the fifth transistor is connected to the pull-down node, a first electrode of the fifth transistor is connected to the output terminal, and a second electrode of the fifth transistor is connected to the third voltage terminal.

Optionally, the input module comprises a first transistor, a gate of the first transistor is connected to the input terminal, a first electrode of the first transistor is connected to the first voltage terminal, and a second electrode of the first transistor is connected to the pull-up node.

Optionally, the reset module comprises a second transistor, a gate of the second transistor is connected to the reset terminal, a first electrode of the second transistor is connected to the pull-up node, and a second electrode of the second transistor is connected to the second voltage terminal.

Optionally, the input module comprises a first transistor, and the reset module comprises a second transistor, one of the first transistor and the second transistor has a gate connected to the input terminal, a first electrode connected to the first voltage terminal, and a second electrode connected to the pull-up node, and the other of the first transistor and the second transistor has a gate connected to the reset terminal, a first electrode connected to the pull-up node, and a second electrode connected to the second voltage terminal.

Optionally, the pull-up module comprises a seventh transistor, an eighth transistor, a ninth transistor and a first capacitor;

a gate of the seventh transistor is connected to the pull-down node, a first electrode of the seventh transistor is connected to the third voltage terminal, and a second electrode of the seventh transistor is connected to the pull-up node;

a gate of the eighth transistor is connected to a first electrode of the ninth transistor, a first electrode of the eighth transistor is connected to the pull-up node, and a second electrode of the eighth transistor is connected to the second signal terminal;

a gate of the ninth transistor is connected to the pull-up node, and a second electrode of the ninth transistor is connected to the second signal terminal; and the first capacitor is connected between the pull-up node and the output terminal.

Optionally, the pull-up module comprises a seventh transistor, an eighth transistor, a ninth transistor, a tenth transistor and a first capacitor;

a gate of the seventh transistor is connected to the pull-down node, a first electrode of the seventh transistor is connected to the third voltage terminal, and a second electrode of the seventh transistor is connected to the pull-up node;

a gate of the eighth transistor is connected to a first electrode of the ninth transistor, a first electrode of the eighth transistor is connected to a second electrode of the tenth transistor, and a second electrode of the eighth transistor is connected to the second signal terminal;

a gate of the ninth transistor is connected to the pull-up node, and a second electrode of the ninth transistor is connected to the second signal terminal;

a gate of the tenth transistor is connected to the first electrode of the ninth transistor, and a first electrode of the tenth transistor is connected to the pull-up node; and the first capacitor is connected between the pull-up node and the output terminal.

The present invention further provides a driving method of a shift register comprising any one of the above-described shift registers, the first voltage terminal being at a high level, the second voltage terminal being at a low level, the third voltage terminal being at a low level, and the driving method comprising:

a first stage, in which the input signal of the first signal terminal is at a low level, the input signal of the input terminal is at a high level, the input signal of the reset terminal is at a low level, and the input signal of the second signal terminal is at a low level;

a second stage, in which the input signal of the first signal terminal is at a high level, the input signal of the input terminal is at a low level, the input signal of the reset terminal is at a low level, and the input signal of the second signal terminal is at a low level;

a third stage, in which the input signal of the first signal terminal is at a low level, the input signal of the input terminal is at a low level, the input signal of the reset terminal is at a high level, and the input signal of the second signal terminal is at a low level;

a fourth stage, in which the input signal of the first signal terminal is at a high level, the input signal of the input terminal is at a low level, the input signal of the reset terminal is at a low level, and the input signal of the second signal terminal is at a low level; and a fifth stage, in which the input signal of the first signal terminal is at a low level, the input signal of the input terminal is at a low level, the input signal of the reset terminal is at a low level, and the input signal of the second signal terminal is at a low level.

Optionally, between the first stage and the second stage, the driving method comprises:

a touch stage, in which the input signal of the first signal terminal is at a low level, the input signal of the input terminal is at a low level, the input signal of the reset terminal is at a low level, and the input signal of the second signal terminal is at a high level.

The present invention further provides a driving circuit comprising a plurality of cascaded shift registers, each of which is any one of the above-described shift registers;

each of the plurality of shift registers except a first-stage shift register has an input terminal connected to an output terminal of an upper-stage shift register, and an output terminal connected to a reset terminal of the upper-stage shift register; and each of the plurality of shift registers except a last-stage shift register has an output terminal connected to an input terminal of a lower-stage shift register, and a reset terminal connected to the output terminal of the lower-stage shift register.

The present invention further provides a display apparatus comprising the above-described driving circuit.

The present invention has the beneficial effects as follows.

In the shift register for a touch display panel and a driving method thereof, a driving circuit and a display apparatus provided by the present invention, the shift register comprises a pull-up unit, a pull-down unit and an output unit, the pull-up unit controls a potential of the pull-up node according to input signals of the input terminal, the second signal terminal and the reset terminal and a potential of the pull-down node, the pull-down unit controls the potential of the pull-down node according to an input signal of the first signal terminal and the potential of the pull-up node, and the output unit controls an output signal of the output terminal according to the input signals of the first signal terminal and the second signal terminal and the potentials of the pull-down node and the pull-up node. In the technical solutions provided by the present invention, the second signal terminal may be regarded as a switching terminal for switch between a touch signal and a display driving signal, during transmission of a touch signal, the second signal terminal is at a high level, and a driving signal is stored; after the transmission of the touch signal is completed, the second signal terminal is at a low level and the driving signal continues to perform scanning, thereby avoiding mutual interference between the touch signal and the driving signal. Therefore, the technical solutions provided by the present invention can be compatible with both an array substrate row driving function of an in-cell touch display panel and a traditional array substrate row driving function, and realize switch between a touch driving function and a display driving function, so that it is ensured that a touch display panel can achieve not only a high resolution display function but also a high precision touch function.

DETAILED DESCRIPTION

To enable those skilled in the art to better understand technical solutions of the present invention, a shift register and a driving method thereof, a driving circuit and a display apparatus provided by the present invention will be described in detail below in conjunction with the accompanying drawings.

First Embodiment

Figure 1:
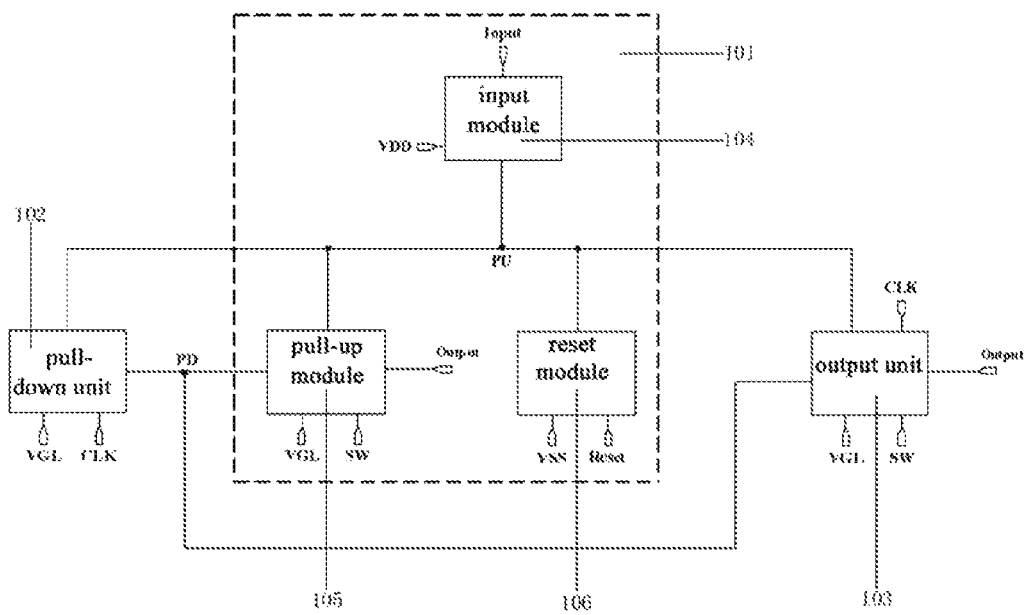
FIG. 1 is a schematic diagram of a structure of a shift register provided by a first embodiment of the present invention.

FIG. 1 is a schematic diagram of a structure of a shift register provided by the first embodiment of the present invention. As shown in FIG. 1, the shift register includes: a pull-up unit 101, a pull-down unit 102 and an output unit 103, the pull-up unit 101 is connected to an input terminal Input, a first voltage terminal VDD, a second voltage terminal VSS, a third voltage terminal VGL, a second signal terminal SW, a reset terminal Reset, an output terminal Output, a pull-down node PD and a pull-up node PU, respectively, the pull-down unit 102 is connected to a first signal terminal CLK, the third voltage terminal VGL, the pull-up node PU and the pull-down node PD, respectively, and the output unit 103 is connected to the third voltage terminal VGL, the first signal terminal CLK, the second signal terminal SW, the output terminal Output, the pull-down node PD and the pull-up node PU, respectively. The pull-up unit 101 controls a potential of the pull-up node PU according to input signals of the input terminal Input, the second signal terminal SW and the reset terminal Reset and a potential of the pull-down node PD, the pull-down unit 102 controls the potential of the pull-down node PD according to an input signal of the first signal terminal CLK and the potential of the pull-up node PU, and the output unit 103 controls an output signal of the output terminal Output according to the input signals of the first signal terminal CLK and the second signal terminal SW and the potentials of the pull-down node PD and the pull-up node PU. In the technical solution provided by the present embodiment, by controlling the level of the second signal terminal SW, a display driving signal is stored during transmission of a touch signal, and continues to perform scanning after the transmission of the touch signal is completed, and thus mutual interference between a touch signal and a driving signal is avoided. Therefore, the technical solution provided by the embodiment can be compatible with both an array substrate row driving function of an in-cell touch display panel and a traditional array substrate row driving function, and realize switch between a touch driving function and a display driving function, so that it is ensured that a touch display panel can achieve not only a high resolution display function but also a high precision touch function.

Figure 2:
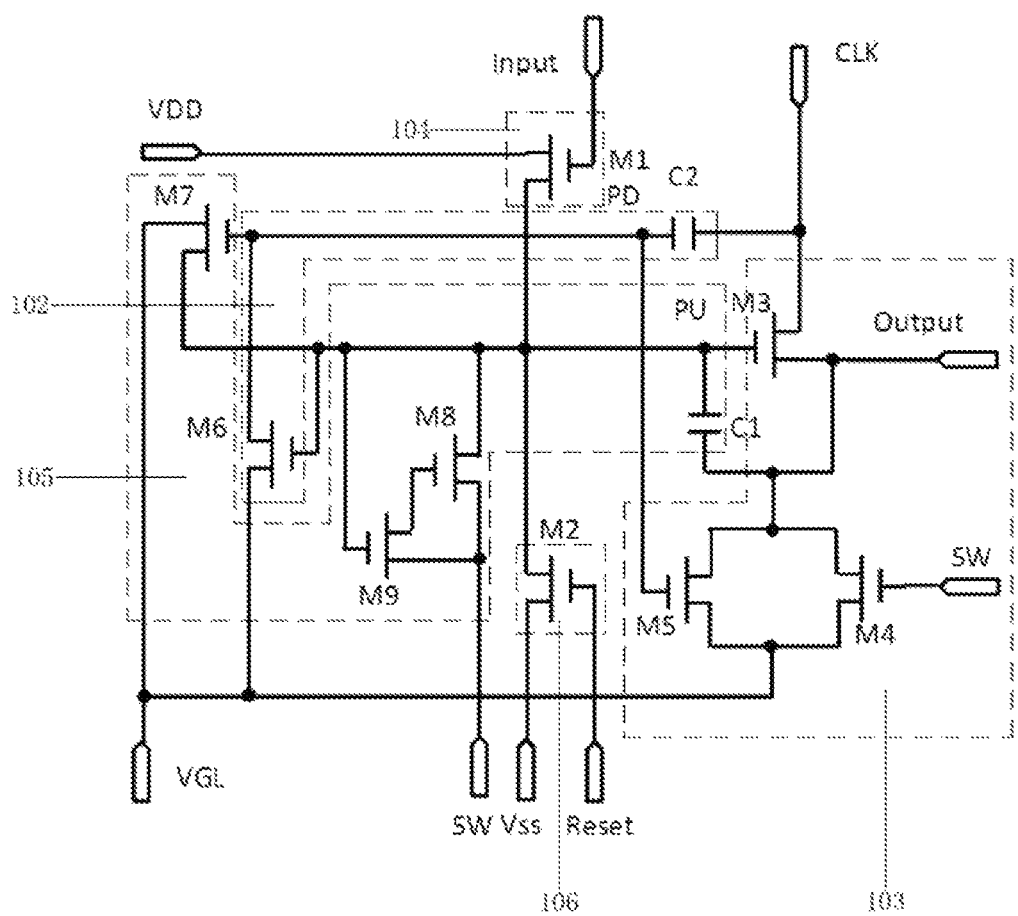
FIG. 2 is a schematic diagram of a first specific structure of the shift register shown in FIG. 1.

FIG. 2 is a schematic diagram of a first specific structure of the shift register shown in FIG. 1. As shown in FIG. 2, the pull-up unit 101 includes an input module 104, a pull-up module 105 and a reset module 106, the input module 104 is connected to the input terminal Input, the first voltage terminal VDD and the pull-up node PU, respectively, the pull-up module 105 is connected to the third voltage terminal VGL, the second signal terminal SW, the output terminal Output, the pull-down node PD and the pull-up node PU, respectively, and the reset module 106 is connected to the second voltage terminal VSS, the reset terminal Reset and the pull-up node PU, respectively. The input module 104 controls the potential of the pull-up node PU according to the input signal of the input terminal Input, the pull-up module 105 controls the potential of the pull-up node PU according to the input signal of the second signal terminal SW and the potential of the pull-down node PD, and the reset module 106 controls the potential of the pull-up node PU according to the input signal of the reset terminal Reset.

In this embodiment, the pull-down unit 102 includes a sixth transistor M6 and a second capacitor C2. The sixth transistor M6 has a gate connected to the pull-up node PU, a first electrode connected to the pull-down node PD, and a second electrode connected to the third voltage terminal VGL, and the second capacitor C2 is connected between the pull-down node PD and the first signal terminal CLK. Optionally, the output unit 103 comprises a third transistor M3, a fourth transistor M4 and a fifth transistor M5. The third transistor M3 has a gate connected to the pull-up node PU, a first electrode connected to the first signal terminal CLK, and a second electrode connected to the output terminal Output, the fourth transistor M4 has a gate connected to the second signal terminal SW, a first electrode connected to the output terminal Output, and a second electrode connected to the third voltage terminal VGL, and the fifth transistor M5 has a gate connected to the pull-down node PD, a first electrode connected to the output terminal Output, and a second electrode connected to the third voltage terminal VGL.

Referring to FIG. 2, the input module 104 includes a first transistor M1, and the first transistor M1 has a gate connected to the input terminal Input, a first electrode connected to the first voltage terminal VDD, and a second electrode connected to the pull-up node PU. The reset module 106 includes a second transistor M2, and the second transistor M2 has a gate connected to the reset terminal Reset, a first electrode connected to the pull-up node PU, and a second electrode connected to the second voltage terminal VSS.

In this embodiment, the pull-up module 105 includes a seventh transistor M7, an eighth transistor M8, a ninth transistor M9 and a first capacitor C1. The seventh transistor M7 has a gate connected to the pull-down node PD, a first electrode connected to the third voltage terminal VGL, and a second electrode connected to the pull-up node PU, the eighth transistor M8 has a gate connected to a first electrode of the ninth transistor M9, a first electrode connected to the pull-up node PU, and a second electrode connected to the second signal terminal SW, the ninth transistor M9 has a gate connected to the pull-up node PU, and a second electrode connected to the second signal terminal SW, and the first capacitor C1 is connected between the pull-up node PU and the output terminal Output.

In the embodiment shown in FIG. 2, it can be seen that the input module 104 and the reset module 106 are two modules provided symmetrically with respect to the pull-up node PU. Therefore, for a gate driving circuit consisting of a plurality of cascaded shift registers, bidirectional scanning of the gate driving circuit can be readily realized.

Figure 3:
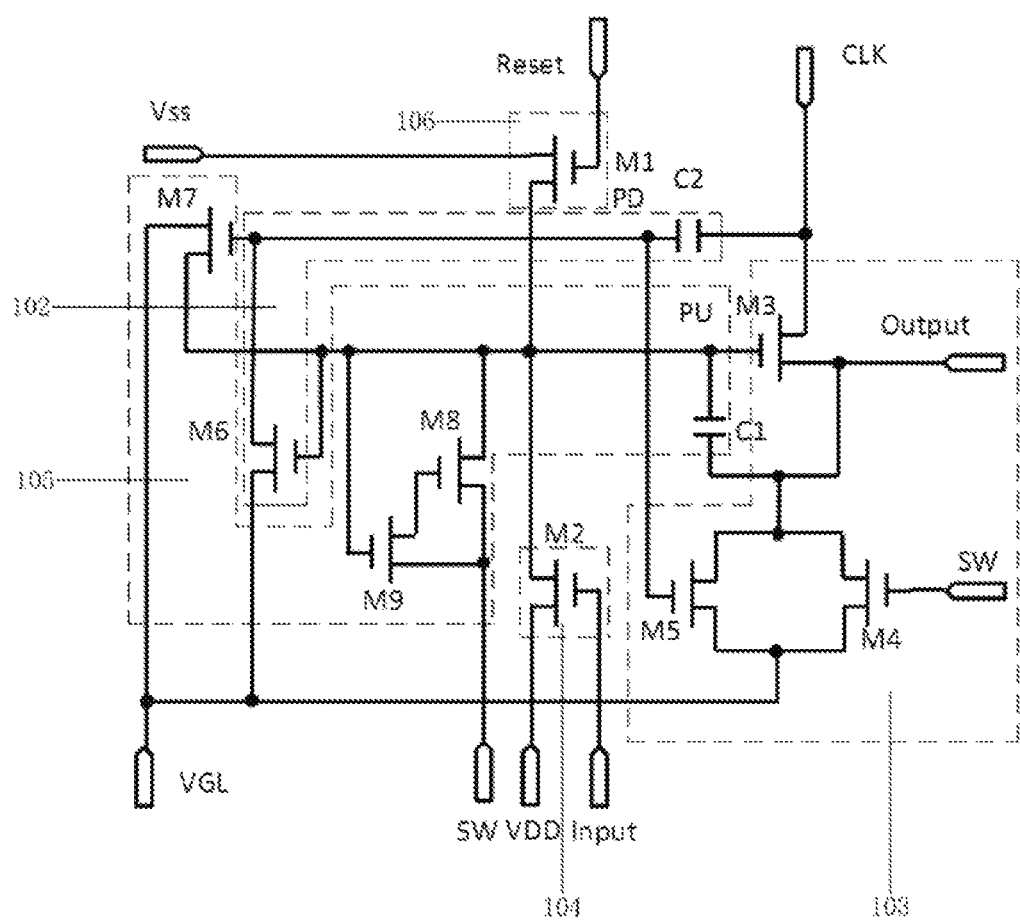
FIG. 3 is a schematic diagram of a second specific structure of the shift register shown in FIG. 1.

Different from the scanning direction shown in FIG. 2, FIG. 3 is a schematic diagram of a second specific structure of the shift register shown in FIG. 1 and shows a shift register having a scanning direction opposite to that shown in FIG. 2. As shown in FIG. 3, the input module 104 includes a second transistor M2, and the second transistor M2 has a gate connected to the input terminal Input, a first electrode connected to the first voltage terminal VDD, and a second electrode connected to the pull-up node PU. The reset module 106 includes a first transistor M1, and the first transistor M1 has a gate connected to the reset terminal Reset, a first electrode connected to the pull-up node PU, and a second electrode connected to the second voltage terminal VSS.

Figure 4:
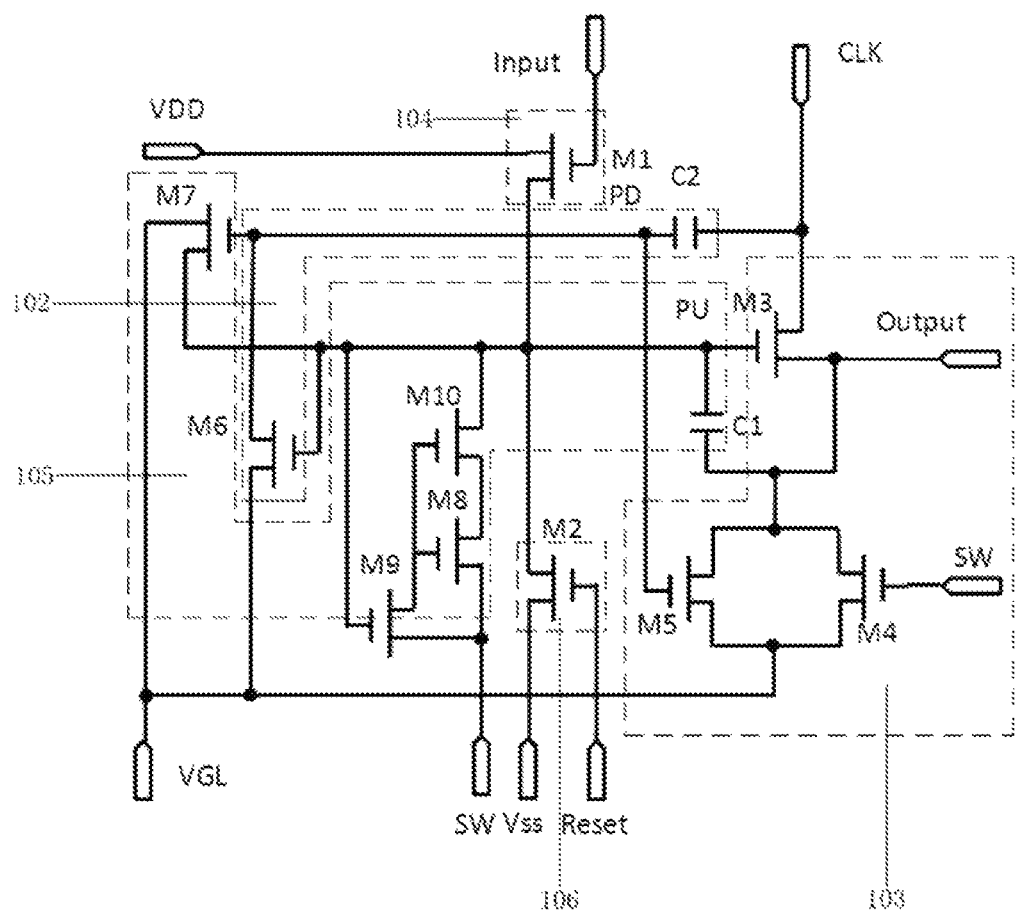
FIG. 4 is a schematic diagram of a third specific structure of the shift register shown in FIG. 1.
Figure 5:
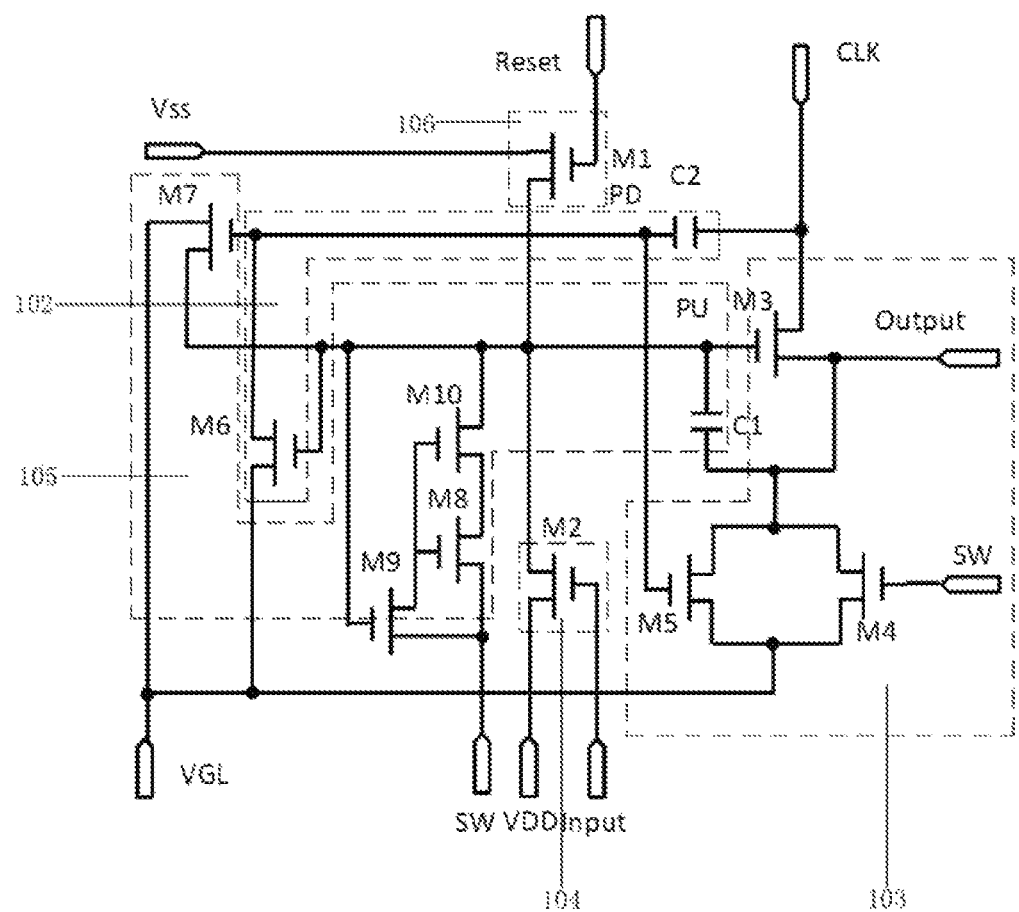
FIG. 5 is a schematic diagram of a fourth specific structure of the shift register shown in FIG. 1.

FIG. 4 is a schematic diagram of a third specific structure of the shift register shown in FIG. 1, and FIG. 5 is a schematic diagram of a fourth specific structure of the shift register shown in FIG. 1. Like FIGS. 2 and 3, FIGS. 4 and 5 respectively show two shift registers having scanning directions opposite to each other. The shift register shown in FIG. 4 differs from the shift register shown in FIG. 2 in that, the shift register shown in FIG. 4 is additionally provided with a tenth transistor M10. Likewise, the shift register shown in FIG. 5 differs from the shift register shown in FIG. 3 in that, the shift register shown in FIG. 5 is additionally provided with a tenth transistor M10. Specifically, the pull-up module 105 includes a seventh transistor M7, an eighth transistor M8, a ninth transistor M9, a tenth transistor M10 and a first capacitor C1. The seventh transistor M7 has a gate connected to the pull-down node PD, a first electrode connected to the third voltage terminal VGL, and a second electrode connected to the pull-up node PU, the eighth transistor M8 has a gate connected to a first electrode of the ninth transistor M9, a first electrode connected to a second electrode of the tenth transistor M10, and a second electrode connected to the second signal terminal SW, the ninth transistor M9 has a gate connected to the pull-up node PU, and a second electrode connected to the second signal terminal SW, the tenth transistor M10 has a gate connected to the first electrode of the ninth transistor M9, and a first electrode connected to the pull-up node PU, and the first capacitor C1 is connected between the pull-up node PU and the output terminal Output. A role of the tenth transistor M10 is to avoid or decrease influence of coupling effect, which is generated when the input signal of the second signal terminal SW varies, on the potential of the pull-up node PU.

The shift register provided by the embodiment includes a pull-up unit, a pull-down unit and an output unit, the pull-up unit controls a potential of the pull-up node according to input signals of the input terminal, the second signal terminal and the reset terminal and a potential of the pull-down node, the pull-down unit controls the potential of the pull-down node according to an input signal of the first signal terminal and the potential of the pull-up node, and the output unit controls an output signal of the output terminal according to the input signals of the first signal terminal and the second signal terminal and the potentials of the pull-down node and the pull-up node. In the technical solutions provided by the embodiment, by controlling the level of the second signal terminal SW, a display driving signal is stored during transmission of a touch signal, and continues to perform scanning after the transmission of the touch signal is completed, and thus mutual interference between the touch signal and the driving signal is avoided. Therefore, the technical solutions provided by the embodiment can be compatible with both an array substrate row driving function of an in-cell touch display panel and a traditional array substrate row driving function, and realize switch between a touch driving function and a display driving function, so that it is ensured that a touch display panel can achieve not only a high resolution display function but also a high precision touch function. In addition, in the shift register in the embodiments of the present invention, the input module and the reset module are symmetrical structures with respect to the pull-up node. Therefore, for a gate driving circuit consisting of a plurality of cascaded shift registers, bidirectional scanning of the gate driving circuit can be readily realized.

Second Embodiment

Figure 6:
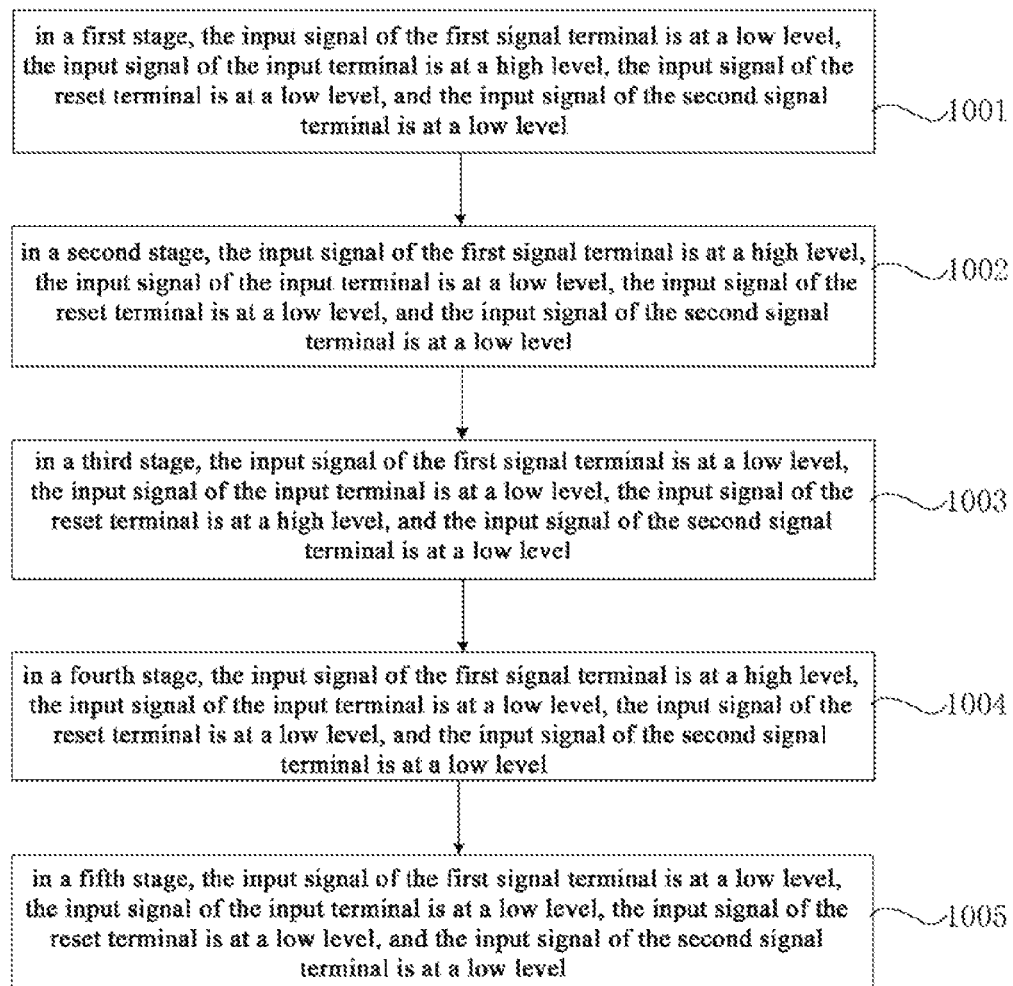
FIG. 6 is a flow chart of a driving method of a shift register provided by a second embodiment of the present invention.

FIG. 6 is a flow chart of a driving method of a shift register provided by the second embodiment of the present invention. As shown in FIG. 6, the shift register includes the shift register provided by the first embodiment, and the specific contents may refer to the description of the first embodiment and are not repeated herein. The present embodiment is described in detail by taking the shift register shown in FIG. 2 as an example, and operating principles of the shift registers shown in FIGS. 3 to 5 are substantially the same as that of the shift register shown in FIG. 2.

In this embodiment, an input signal of the first voltage terminal VDD is at a high level, an input signal of the second voltage terminal VSS is at a low level, an input signal of the third voltage terminal VGL is at a low level, and the driving method includes steps as follows.

Step 1001 includes a first stage, in which the input signal of the first signal terminal is at a low level, the input signal of the input terminal is at a high level, the input signal of the reset terminal is at a low level, and the input signal of the second signal terminal is at a low level.

Figure 7:
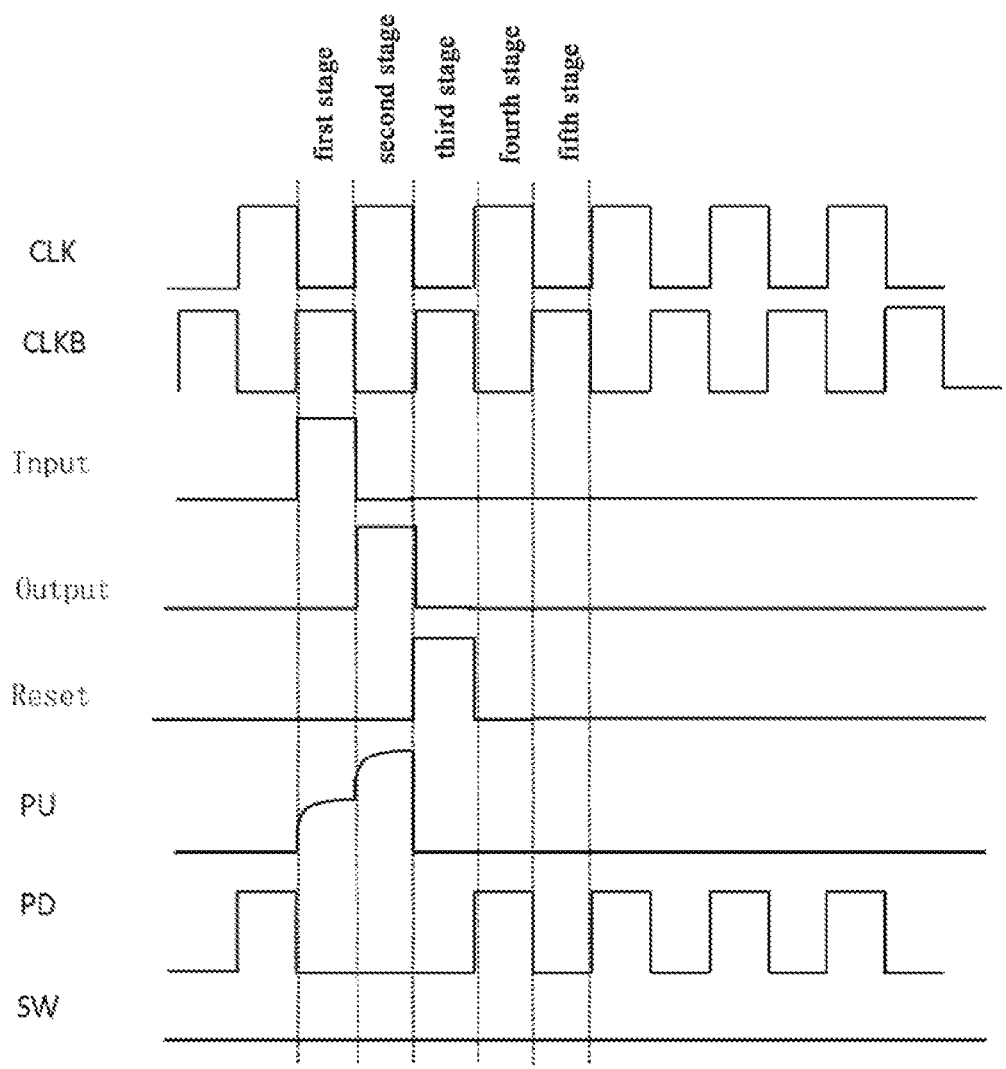
FIG. 7 is an operating timing diagram of a shift register provided by the second embodiment of the present invention.

FIG. 7 is an operating timing diagram of a shift register provided by the second embodiment of the present invention. As shown in FIG. 7, the input signal of the first signal terminal CLK is at a low level, the input signal of the input terminal Input is at a high level, the input signal of the reset terminal Reset is at a low level, and the input signal of the second signal terminal SW is at a low level. In this case, the first transistor M1 is turned on, the first voltage terminal VDD charges the first capacitor C1 through the first transistor M1, so as to pull up the voltage of the pull-up node PU to a high level. Once the pull-up node PU is at a high level, the sixth transistor M6 is turned on, and the third voltage terminal VGL pulls down the voltage of the pull-down node PD to a low level. Once the pull-down node PD is at a low level, the fifth transistor M5 and the seventh transistor M7 are turned off thereby ensuring stability of signal output.

Step 1002 includes a second stage, in which the input signal of the first signal terminal is at a high level, the input signal of the input terminal is at a low level, the input signal of the reset terminal is at a low level, and the input signal of the second signal terminal is at a low level.

In the embodiment, the input signal of the first signal terminal CLK is at a high level, the input signal of the input terminal Input is at a low level, the input signal of the reset terminal Reset is at a low level, and the input signal of the second signal terminal SW is at a low level. In this case, the eighth transistor M8, the fourth transistor M4 and the first transistor M1 are turned off, the pull-up node PU remains at a high level, and the third transistor M3 remains in an ON state. Since the first signal terminal CLK is at a high level, at this point, the voltage of the pull-up node PU is amplified due to bootstrapping, and the output terminal Output outputs a high level. At this time, the pull-up node PU is at a high level, and the sixth transistor M6 is still in an ON state, so the fifth transistor M5 and the seventh transistor M7 are turned off, thereby ensuring stability of signal output.

Step 1003 includes a third stage, in which the input signal of the first signal terminal is at a low level, the input signal of the input terminal is at a low level, the input signal of the reset terminal is at a high level, and the input signal of the second signal terminal is at a low level.

In the embodiment, the input signal of the first signal terminal CLK is at a low level, the input signal of the input terminal Input is at a low level, the input signal of the reset terminal Reset is at a high level, and the input signal of the second signal terminal SW is at a low level. In this case, the second transistor M2 is turned on, the low level of the second voltage terminal VSS pulls down the voltage of the pull-up node PU to a low level, and the third transistor M3 is turned off.

Step 1004 includes a fourth stage, in which the input signal of the first signal terminal is at a high level, the input signal of the input terminal is at a low level, the input signal of the reset terminal is at a low level, and the input signal of the second signal terminal is at a low level.

In the embodiment, the input signal of the first signal terminal CLK is at a high level, the input signal of the input terminal Input is at a low level, the input signal of the reset terminal Reset is at a low level, and the input signal of the second signal terminal SW is at a low level. In this case, the pull-up node PU is at a low level, the sixth transistor M6 is turned off, so that the voltage of the pull-down node PD is pulled up to a high level, and the fifth transistor M5 is turned on to denoise the output terminal Output. In the meanwhile, the pull-down node PD is at a high level, and the seventh transistor M7 is turned on to denoise the pull-up node PU. With the foregoing denosing operations, coupled noise voltage produced at the first signal terminal CLK can be eliminated, so that low-level output from the output terminal Output is achieved, thereby ensuring stability of signal output.

Step 1005 includes a fifth stage, in which the input signal of the first signal terminal is at a low level, the input signal of the input terminal is at a low level, the input signal of the reset terminal is at a low level, and the input signal of the second signal terminal is at a low level.

In the embodiment, the input signal of the first signal terminal CLK is at a low level, the input signal of the input terminal Input is at a low level, the input signal of the reset terminal Reset is at a low level, and the input signal of the second signal terminal SW is at a low level. In this case, the sixth transistor M6 is turned off, the pull-down node PD is at a low level, and the seventh transistor M7 and the fifth transistor M5 are turned off, thereby ensuring stability of signal output.

Figure 8:
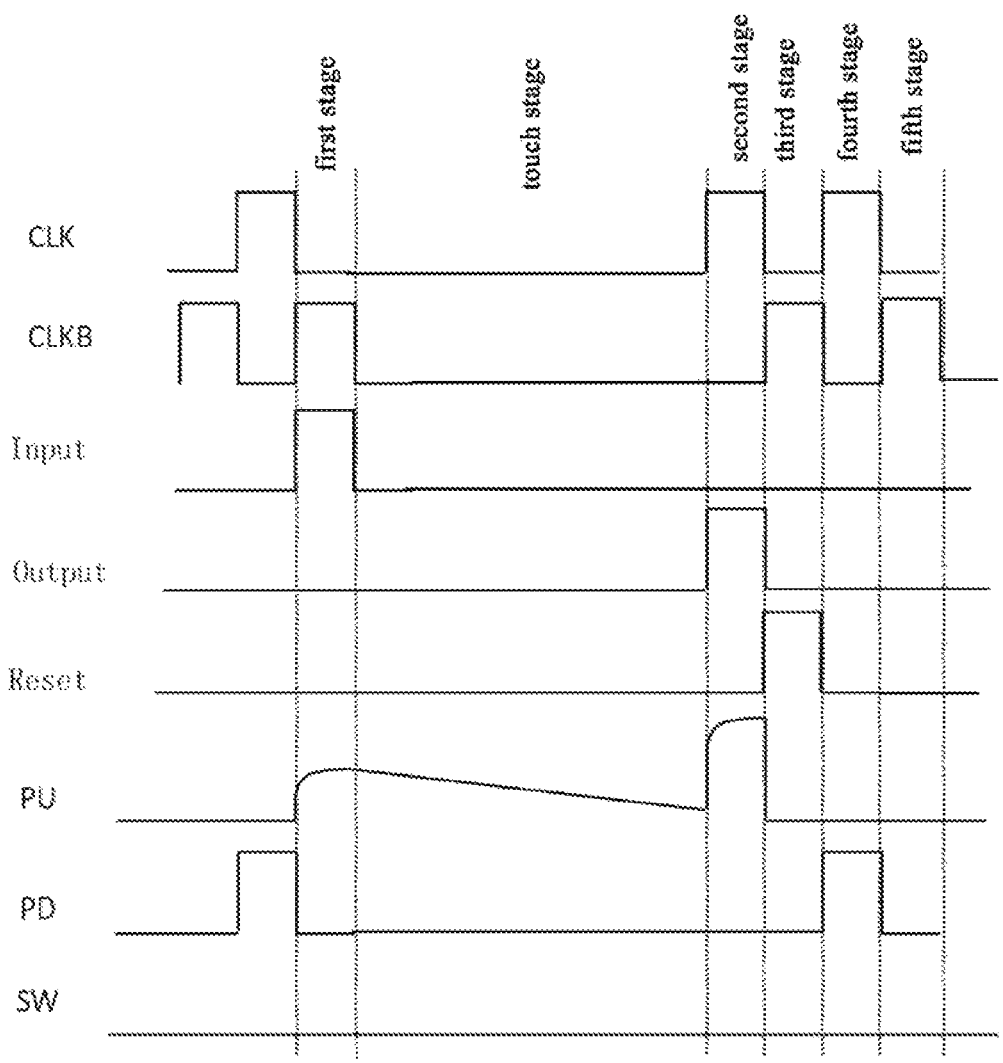
FIG. 8 is an operating timing diagram of a shift register in the prior art.
Figure 9:
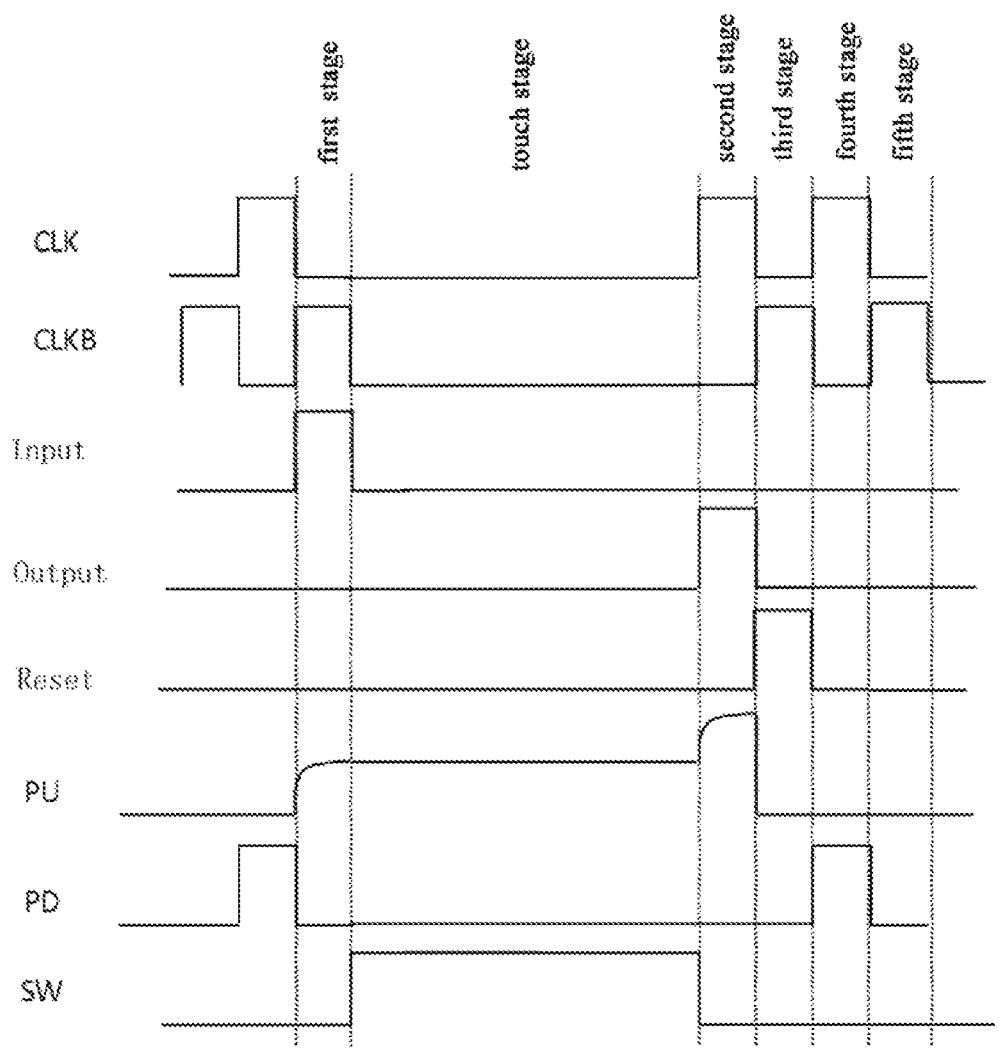
FIG. 9 is another operating timing diagram of a shift register provided by the second embodiment of the present invention.

FIG. 8 is an operating timing diagram of a shift register in the prior art. As shown in FIG. 8, an existing operating timing is as follows: the input signal of the first signal terminal CLK is at a low level, the input signal of the input terminal Input is at a low level, the input signal of the reset terminal Reset is at a low level, and the input signal of the second signal terminal SW is at a low level. In this case, the pull-up node PU is at a high level, the pull-down node PD is at a low level, the second transistor M2 and the seventh transistor M7 are turned off but leakage phenomena occur to the second transistor M2 and the seventh transistor M7, and the leakage phenomena will pull down the voltage of the pull-up node PU, and may lead to the problem of no output voltage or too low output voltage of the shift register. For this reason, in the present embodiment, the second signal terminal SW is supplied with a high level to charge the first capacitor C1 supplementarily. FIG. 9 is another operating timing diagram of a shift register provided by the second embodiment of the present invention. As shown in FIG. 9, between the first stage and the second stage, the driving method includes a touch stage, in which the input signal of the first signal terminal CLK is at a low level, the input signal of the input terminal Input is at a low level, the input signal of the reset terminal Reset is at a low level, and the input signal of the second signal terminal SW is at a high level. In this case, the pull-up node PU is at a high level, the eighth transistor M8 and the ninth transistor M9 are turned on, and the high level of the second signal terminal SW charges the first capacitor C1 supplementarily, so as to prevent the leakage phenomena of the second and seventh transistors M2 and M7 from pulling down the voltage of the pull-up node PU to cause the problem of no output voltage or too low output voltage of the shift register.

In the embodiment, in the touch stage, a touch signal is transmitted, the pull-up node PU is at a high level, the pull-down node PD is at a low level, and since the second signal terminal SW is at a high level, the fourth transistor M4 is turned on to denoise the output terminal Output; at this point, the touch signal is transmitted, no driving signal is transmitted, and the driving signal continues to perform scanning after the transmission of the touch signal is completed, thereby avoiding mutual interference between the touch signal and the driving signal.

In the driving method of a shift register provided by the embodiment, the shift register includes a pull-up unit, a pull-down unit and an output unit, the pull-up unit controls a potential of the pull-up node according to input signals of the input terminal, the second signal terminal and the reset terminal and a potential of the pull-down node, the pull-down unit controls the potential of the pull-down node according to an input signal of the first signal terminal and the potential of the pull-up node, and the output unit controls an output signal of the output terminal according to the input signals of the first signal terminal and the second signal terminal and the potentials of the pull-down node and the pull-up node. In the technical solutions provided by the embodiment, in the touch stage in which a touch signal is transmitted, the second signal terminal is at a high level, a display driving signal is stored, whereas after the transmission of the touch signal is completed, the second signal terminal is at a low level, and the display driving signal continues to perform scanning, thereby avoiding mutual interference between the touch signal and the driving signal. Therefore, the technical solutions provided by the embodiment can be compatible with both an array substrate row driving function of an in-cell touch display panel and a traditional array substrate row driving function, and realize switch between a touch driving function and a display driving function, so that it is ensured that a touch display panel can achieve not only a high resolution display function but also a high precision touch function.

Third Embodiment

Figure 10:
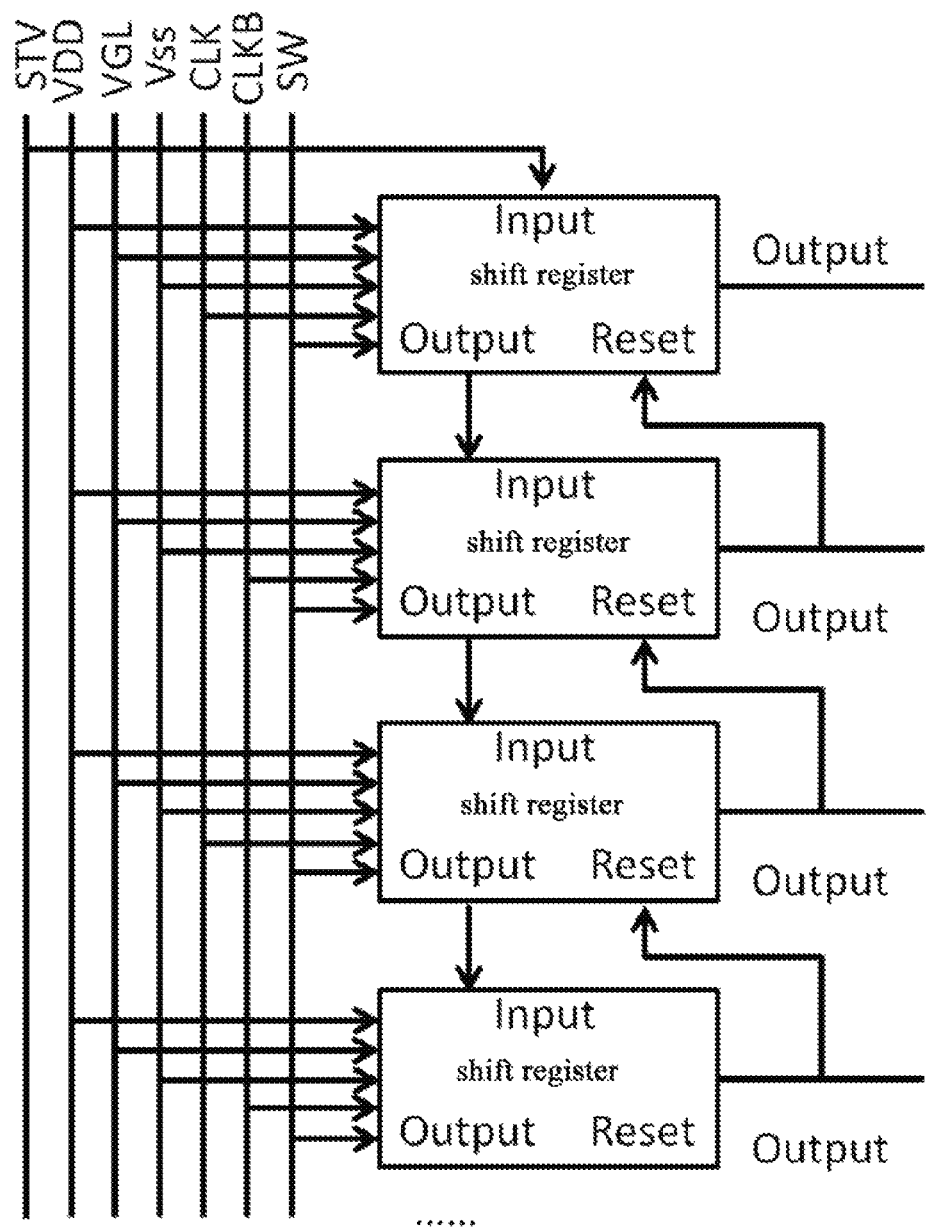
FIG. 10 is a schematic diagram of a structure of a driving circuit provided by a third embodiment of the present invention.

FIG. 10 is a schematic diagram of a structure of a driving circuit provided by the third embodiment of the present invention. As shown in FIG. 10, the driving circuit includes a plurality of cascaded shift registers, each of which is the shift register provided by the first embodiment, and specific contents thereof may refer to the description of the first embodiment and are not repeated herein.

In the embodiment, each of the shift registers except a first-stage shift register has an input terminal connected to the output terminal of an upper-stage shift register, and an output terminal connected to the reset terminal of the upper-stage shift register. Each of the plurality of shift registers except a last-stage shift register has an output terminal connected to the input terminal of a lower-stage shift register, and a reset terminal connected to the output terminal of the lower-stage shift register.

In the driving circuit provided by the embodiment, the shift register includes a pull-up unit, a pull-down unit and an output unit, the pull-up unit controls a potential of the pull-up node according to input signals of the input terminal, the second signal terminal and the reset terminal and a potential of the pull-down node, the pull-down unit controls the potential of the pull-down node according to an input signal of the first signal terminal and the potential of the pull-up node, and the output unit controls an output signal of the output terminal according to the input signals of the first signal terminal and the second signal terminal and the potentials of the pull-down node and the pull-up node. In the technical solutions provided by the embodiment, by controlling the level of the second signal terminal, a driving signal is stored during transmission of a touch signal, and continues to perform scanning after the transmission of the touch signal is completed, and thus mutual interference between the touch signal and the driving signal is avoided. Therefore, the technical solutions provided by the embodiment can be compatible with both an array substrate row driving function of an in-cell touch display panel and a traditional array substrate row driving function, and realize switch between a touch driving function and a display driving function, so that it is ensured that a touch display panel can achieve not only a high resolution display function but also a high precision touch function.

Fourth Embodiment

This embodiment provides a display apparatus including the driving circuit provided in the third embodiment, and specific contents thereof may refer to the description of the first embodiment and are not repeated herein.

In the display apparatus provided by the embodiment, the shift register includes a pull-up unit, a pull-down unit and an output unit, the pull-up unit controls a potential of the pull-up node according to input signals of the input terminal, the second signal terminal and the reset terminal and a potential of the pull-down node, the pull-down unit controls the potential of the pull-down node according to an input signal of the first signal terminal and the potential of the pull-up node, and the output unit controls an output signal of the output terminal according to the input signals of the first signal terminal and the second signal terminal and the potentials of the pull-down node and the pull-up node. In the technical solutions provided by the embodiment, by controlling the level of the second signal terminal, a driving signal is stored during transmission of a touch signal, and continues to perform scanning after the transmission of the touch signal is completed, and thus mutual interference between the touch signal and the driving signal is avoided. Therefore, the technical solutions provided by the embodiment can be compatible with both an array substrate row driving function of an in-cell touch display panel and a traditional array substrate row driving function, and realize switch between a touch driving function and a display driving function, so that it is ensured that a touch display panel can achieve not only a high resolution display function but also a high precision touch function.

It can be understood that, the above implementations are merely exemplary implementations used for explaining the principle of the present invention, but the present invention is not limited thereto. For those skilled in the art, various modifications and improvements can be made without departing from the spirit and essence of the present invention, and these modifications and improvements are also deemed as falling within the protection scope of the present invention.

The invention claimed is:

1. A shift register, comprising:
a pull-up unit, connected to an input terminal, a first voltage terminal, a second voltage terminal, a third voltage terminal, a second signal terminal, a reset terminal, an output terminal, a pull-down node and a pull-up node, respectively, and configured to control a potential of the pull-up node according to input signals of the input terminal, the second signal terminal and the reset terminal and a potential of the pull-down node;
a pull-down unit, connected to a first signal terminal, the third voltage terminal, the pull-up node and the pull-down node, respectively, and configured to control the potential of the pull-down node according to an input signal of the first signal terminal and the potential of the pull-up node; and
an output unit, connected to the third voltage terminal, the first signal terminal, the second signal terminal, the output terminal, the pull-down node and the pull-up node, respectively, and configured to control an output signal of the output terminal according to the input signal of the first signal terminal, an input signal of the second signal terminal and the potentials of the pull-down node and the pull-up node;
wherein the pull-up unit comprises:
an input module, connected to the input terminal, the first voltage terminal and the pull-up node, respectively, and configured to control the potential of the pull-up node according to the input signal of the input terminal;
a pull-up module, connected to the third voltage terminal, the second signal terminal, the output terminal, the pull-down node and the pull-up node, respectively, and configured to control the potential of the pull-up node according to the input signal of the second signal terminal and the potential of the pull-down node; and
a reset module, connected to the second voltage terminal, the reset terminal and the pull-up node, respectively, and configured to control the potential of the pull-up node according to the input signal of the reset terminal;
wherein the pull-up module comprises a seventh transistor, an eighth transistor, a ninth transistor and a first capacitor;
a gate of the seventh transistor is connected to the pull-down node, a first electrode of the seventh transistor is connected to the third voltage terminal, and a second electrode of the seventh transistor is connected to the pull-up node;
a gate of the eighth transistor is connected to a first electrode of the ninth transistor, a first electrode of the eighth transistor is connected to the pull-up node, and a second electrode of the eighth transistor is connected to the second signal terminal;

a gate of the ninth transistor is connected to the pull-up node, and a second electrode of the ninth transistor is connected to the second signal terminal; and the first capacitor is connected between the pull-up node and the output terminal.

2. The shift register according to claim 1, wherein the output unit comprises a third transistor, a fourth transistor and a fifth transistor;

a gate of the third transistor is connected to the pull-up node, a first electrode of the third transistor is connected to the first signal terminal, and a second electrode of the third transistor is connected to the output terminal;

a gate of the fourth transistor is connected to the second signal terminal, a first electrode of the fourth transistor is connected to the output terminal, and a second electrode of the fourth transistor is connected to the third voltage terminal; and a gate of the fifth transistor is connected to the pull-down node, a first electrode of the fifth transistor is connected to the output terminal, and a second electrode of the fifth transistor is connected to the third voltage terminal.

3. The shift register according to claim 2, wherein the input module comprises a first transistor, a gate of the first transistor is connected to the input terminal, a first electrode of the first transistor is connected to the first voltage terminal, and a second electrode of the first transistor is connected to the pull-up node.

4. The shift register according to claim 2, wherein the reset module comprises a second transistor, a gate of the second transistor is connected to the reset terminal, a first electrode of the second transistor is connected to the pull-up node, and a second electrode of the second transistor is connected to the second voltage terminal.

5. The shift register according to claim 2, wherein the input module comprises a first transistor, the reset module comprises a second transistor, one of the first transistor and the second transistor has a gate connected to the input terminal, a first electrode connected to the first voltage terminal, and a second electrode connected to the pull-up node, and the other of the first transistor and the second transistor has a gate connected to the reset terminal, a first electrode connected to the pull-up node, and a second electrode connected to the second voltage terminal.

6. A driving circuit, comprising a plurality of cascaded shift registers, each of which is the shift register according to claim 2; wherein each of the plurality of shift registers except a first-stage shift register has an input terminal connected to an output terminal of an upper-stage shift register, and an output terminal connected to a reset terminal of the upper-stage shift register; and each of the plurality of shift registers except a last-stage shift register has an output terminal connected to an input terminal of a lower-stage shift register, and a reset terminal connected to an output terminal of the lower-stage shift register.

7. A driving method of a shift register, wherein the shift register is the shift register according to claim 1, the first voltage terminal is at a high level, the second voltage terminal is at a low level, and the third voltage terminal is at a low level; and the driving method comprises:

a first stage, in which the input signal of the first signal terminal is at a low level, the input signal of the input terminal is at a high level, the input signal of the reset terminal is at a low level, and the input signal of the second signal terminal is at a low level;

a second stage, in which the input signal of the first signal terminal is at a high level, the input signal of the input terminal is at a low level, the input signal of the reset terminal is at a low level, and the input signal of the second signal terminal is at a low level;

a third stage, in which the input signal of the first signal terminal is at a low level, the input signal of the input terminal is at a low level, the input signal of the reset terminal is at a high level, and the input signal of the second signal terminal is at a low level;

a fourth stage, in which the input signal of the first signal terminal is at a high level, the input signal of the input terminal is at a low level, the input signal of the reset terminal is at a low level, and the input signal of the second signal terminal is at a low level; and a fifth stage, in which the input signal of the first signal terminal is at a low level, the input signal of the input terminal is at a low level, the input signal of the reset terminal is at a low level, and the input signal of the second signal terminal is at a low level.

8. The driving method of a shift register according to claim 7, wherein between the first stage and the second stage, the driving method comprises:

a touch stage, in which the input signal of the first signal terminal is at a low level, the input signal of the input terminal is at a low level, the input signal of the reset terminal is at a low level, and the input signal of the second signal terminal is at a high level.

9. A driving circuit, comprising a plurality of cascaded shift registers, each of which is the shift register according to claim 1; wherein each of the plurality of shift registers except a first-stage shift register has an input terminal connected to an output terminal of an upper-stage shift register, and an output terminal connected to a reset terminal of the upper-stage shift register; and each of the plurality of shift registers except a last-stage shift register has an output terminal connected to an input terminal of a lower-stage shift register, and a reset terminal connected to an output terminal of the lower-stage shift register.

10. A display apparatus, comprising the driving circuit according to claim 9.

11. A shift register, comprising:

a pull-up unit, connected to an input terminal, a first voltage terminal, a second voltage terminal, a third voltage terminal, a second signal terminal, a reset terminal, an output terminal, a pull-down node and a pull-up node, respectively, and configured to control a potential of the pull-up node according to input signals of the input terminal, the second signal terminal and the reset terminal and a potential of the pull-down node;

a pull-down unit, connected to a first signal terminal, the third voltage terminal, the pull-up node and the pull-down node, respectively, and configured to control the potential of the pull-down node according to an input signal of the first signal terminal and the potential of the pull-up node; and an output unit, connected to the third voltage terminal, the first signal terminal, the second signal terminal, the output terminal, the pull-down node and the pull-up node, respectively, and configured to control an output signal of the output terminal according to the input signal of the first signal terminal, an input signal of the second signal terminal and the potentials of the pull-down node and the pull-up node, wherein the pull-up unit comprises:

an input module, connected to the input terminal, the first voltage terminal and the pull-up node, respectively, and configured to control the potential of the pull-up node according to the input signal of the input terminal;

a pull-up module, connected to the third voltage terminal, the second signal terminal, the output terminal, the pull-down node and the pull-up node, respectively, and configured to control the potential of the pull-up node according to the input signal of the second signal terminal and the potential of the pull-down node; and a reset module, connected to the second voltage terminal, the reset terminal and the pull-up node, respectively, and configured to control the potential of the pull-up node according to the input signal of the reset terminal, wherein the pull-up module comprises a seventh transistor, an eighth transistor, a ninth transistor, a tenth transistor and a second capacitor;

a gate of the seventh transistor is connected to the pull-down node, a first electrode of the seventh transistor is connected to the third voltage terminal, and a second electrode of the seventh transistor is connected to the pull-up node;

a gate of the eighth transistor is connected to a first electrode of the ninth transistor, a first electrode of the eighth transistor is connected to a second electrode of the tenth transistor, and a second electrode of the eighth transistor is connected to the second signal terminal;

a gate of the ninth transistor is connected to the pull-up node, and a second electrode of the ninth transistor is connected to the second signal terminal;

a gate of the tenth transistor is connected to the first electrode of the ninth transistor, and a first electrode of the tenth transistor is connected to the pull-up node; and the second capacitor is connected between the pull-up node and the output terminal.

* * * * *